(12) United States Patent
Lo et al.

(10) Patent No.: US 8,085,354 B2
(45) Date of Patent: Dec. 27, 2011

(54) PIXEL STRUCTURE WITH SEMICONDUCTOR OF TOP-GATE TFT EXTENDED OVER ELECTRODES AND LIQUID CRYSTAL DISPLAY PANEL

(75) Inventors: Cheng Lo, Taipei (TW); Shih-Chyuan Fan Jiang, Taipei (TW); Ching-Sheng Cheng, Kaohsiung County (TW); Ching-Huan Lin, Tainan County (TW); Chih-Jen Hu, Hsinchu (TW); Chih-Ming Chang, Taoyuan County (TW)

(73) Assignee: Au Optronics Corporation, Hsinchu (TW)

( * ) Notice: Subject to any disclaimer, the term of this patent is extended or adjusted under 35 U.S.C. 154(b) by 418 days.

(21) Appl. No.: 12/368,966

(22) Filed: Feb. 10, 2009

(65) Prior Publication Data
US 2010/0044716 A1 Feb. 25, 2010

(30) Foreign Application Priority Data
Aug. 19, 2008 (TW) ................. 97131633 A

(51) Int. Cl.
*G02F 1/136* (2006.01)
*G09G 3/30* (2006.01)
*H01L 29/04* (2006.01)

(52) U.S. Cl. ............. 349/47; 349/42; 349/43; 349/46; 345/92; 257/59; 257/72

(58) Field of Classification Search .......... 349/42, 349/43, 46–48; 345/92; 257/59, 72
See application file for complete search history.

(56) References Cited

U.S. PATENT DOCUMENTS

| | | |
|---|---|---|
| 7,250,996 B2 | 7/2007 | Yoshida et al. |
| 2005/0185120 A1 | 8/2005 | Kitoh et al. |
| 2006/0091387 A1 | 5/2006 | Yamazaki |
| 2006/0268186 A1 | 11/2006 | Kamada et al. |
| 2008/0121893 A1* | 5/2008 | Kim et al. ............ 257/72 |
| 2008/0239227 A1* | 10/2008 | Fan Jiang et al. ...... 349/144 |
| 2009/0079892 A1* | 3/2009 | Hsien et al. ........... 349/47 |

* cited by examiner

*Primary Examiner* — Hoan Nguyen
(74) *Attorney, Agent, or Firm* — Jianq Chyun IP Office

(57) ABSTRACT

A pixel structure is disclosed. The pixel structure is suitable to be disposed on a substrate and includes a first pixel electrode, a second pixel electrode and a top gate TFT. The first pixel electrode and the second pixel electrode are disposed over the substrate, wherein the first pixel electrode and the second pixel electrode are separated from each other. The top gate TFT is disposed between the substrate and the first pixel electrode and includes a patterned semiconductor layer and a gate.

20 Claims, 13 Drawing Sheets

US 8,085,354 B2

PIXEL STRUCTURE WITH SEMICONDUCTOR OF TOP-GATE TFT EXTENDED OVER ELECTRODES AND LIQUID CRYSTAL DISPLAY PANEL

CROSS-REFERENCE TO RELATED APPLICATION

This application claims the priority benefit of Taiwan application serial no. 97131633, filed on Aug. 19, 2008. The entirety of the above-mentioned patent application is hereby incorporated by reference herein and made a part of specification.

BACKGROUND OF THE INVENTION

1. Field of the Invention

The present invention generally relates to a liquid crystal display panel (LCD panel), and more particularly, to a pixel structure in an LCD panel.

2. Description of Related Art

A thin film transistor liquid crystal display (TFT LCD) in the current market is being developed mainly focusing on high contrast ratio, no grayscale inversion, high brightness, high color saturation, fast response and wide-viewing angle. The common wide-viewing technique today includes twisted nematic liquid crystal display (TN LCD) with wide-viewing film, in-plane switching LCD (IPS LCD), fringe field switching LCD (FFS LCD) and multi-domain vertical alignment LCD (MVA LCD). In an MVA LCD, for example, a plurality of alignment patterns, for example, alignment protrusions or slits, are used so as to make the liquid crystal molecules in each pixel arranged in multi directions and thereby obtain different alignment domains. Since the alignment protrusions or the slits formed on a color filter substrate (CF substrate) or a thin film transistor array substrate (TFT array substrate) enable the liquid crystal molecules to be arranged in multi directions to obtain different alignment domains, therefore, a conventional MVA LCD panel achieves the required wide-viewing angle.

FIG. 1A is a top view diagram of a conventional LCD panel and FIG. 1B is a cross-sectional diagram of FIG. 1A along the line I1-I1'. In a conventional transflective multi-domain vertical alignment liquid crystal display panel (transflective MVA LCD) 100, a plurality of alignment protrusions P is disposed on the CF substrate thereof, wherein the alignment protrusions P are distributed over reflective electrodes 103 and transmissive electrodes 104. In addition, a main slit SS is disposed between each transmissive electrode 104 and each reflective electrode 103, so that the liquid crystals LC at the edges of the transmissive electrode 104 and the reflective electrode 103 tilt towards the alignment protrusion P. Since the alignment protrusion P is disposed between the reflective electrode 103 and the transmissive electrode 104 to change the electric field distribution; therefore, the crystals LC tilt towards the alignment protrusion P so that to the required wide-viewing angle is achieved. Besides, a connecting portion 105 is disposed between each reflective electrode 103 and each transmissive electrode 104, which makes the reflective electrode 103 and the transmissive electrode 104 electrically connected to each other, wherein the material of the connecting portion 105 may be the same with that of the reflective electrode 103 or the transmissive electrode 104.

However, the above-mentioned connecting portion 105 would influence the electric field distribution in the liquid crystal layer. Under a normal operation condition, the liquid crystal molecules still can be arranged stably, but once the LCD panel is pressed and exerted by an external force, the connecting portion 105 may cause the liquid crystal molecules to be arranged in mess. That is, the liquid crystal molecules in an LCD panel are affected by the above-mentioned twisted electric field when an external force is exerted on the LCD panel and the liquid crystal molecules are unable to be quickly restored into the original arrangement, which results in apparent finger press mura and seriously affecting the quality of the LCD panel.

SUMMARY OF THE INVENTION

Accordingly, the present invention is directed to a pixel structure capable of effectively mitigating the finger press mura when the invented pixel structure is used in an LCD panel.

The present invention is also directed to an LCD panel, wherein the liquid crystal molecules can be quickly restored into the original arrangement after an external force is exerted on and presses the LCD panel.

As embodied and broadly described herein, the present invention provides a pixel structure disposed on a substrate. The pixel structure includes a first pixel electrode, a second pixel electrode and a top gate thin film transistor (top gate TFT). The first pixel electrode and the second pixel electrode are disposed over the substrate, wherein the first pixel electrode and the second pixel electrode are separated from each other. The top gate TFT is disposed between the substrate and the first pixel electrode, and the top gate TFT includes a patterned semiconductor layer disposed and a gate. The patterned semiconductor layer is disposed on the substrate and has a plurality of conductive doping regions and at least a channel region between the conductive doping regions, wherein one of the conductive doping regions extends from below the first pixel electrode to below the second pixel electrode and is electrically connected to the first pixel electrode and the second pixel electrode. The gate is disposed over the channel regions.

The present invention provides an LCD panel, which includes the above-mentioned TFT array substrate, an opposite substrate and a liquid crystal layer. The opposite substrate is disposed over the TFT array substrate. The liquid crystal layer is disposed between the TFT array substrate and the opposite substrate.

In an embodiment of the present invention, the above-mentioned first pixel electrode and the second pixel electrode are reflective or transmissive.

In an embodiment of the present invention, the above-mentioned patterned semiconductor layer is substantially of L-shape.

In an embodiment of the present invention, the above-mentioned patterned semiconductor layer has three conductive doping regions and two channel regions, and each of the channel regions is respectively connected between two of the conductive doping regions.

In an embodiment of the present invention, the above-mentioned gate is a conductive line with a branch and the conductive line is located over and covers all the channel regions.

In an embodiment of the present invention, the above-mentioned conductive doping region electrically connected to the first pixel electrode and the second pixel electrode includes a first type doping region and a second type doping region, wherein the second type doping region is connected to the first type doping region, the first pixel electrode is electrically connected to both the first type doping region and the second type doping region, and the second pixel electrode is electrically connected to the second type doping region only.

In an embodiment of the present invention, the above-mentioned pixel structure further includes a buffer layer disposed between the substrate and the patterned semiconductor layer.

In an embodiment of the present invention, the above-mentioned pixel structure further includes a gate insulating layer, a first dielectric layer, a first contact conductor, a second contact conductor and a second dielectric layer. The gate insulating layer is disposed on the substrate to cover the patterned semiconductor layer, wherein the first dielectric layer is disposed on the gate insulating layer, a first contact hole and a second contact hole are formed within the first dielectric layer and the gate insulating layer to expose two portions of the patterned semiconductor layer, respectively. The first contact conductor is disposed on the first dielectric layer and electrically connected to the patterned semiconductor layer through the first contact hole. The second contact conductor is disposed on the first dielectric layer and electrically connected to the patterned semiconductor layer through the second contact hole. The second dielectric layer is disposed on the first dielectric layer, wherein the second dielectric layer has a third contact hole and a fourth contact hole to respectively expose the first contact conductor and the second contact conductor, the first pixel electrode is electrically connected to the first contact conductor through the third contact hole and the second pixel electrode is electrically connected to the second contact conductor through the fourth contact hole.

In an embodiment of the present invention, the above-mentioned pixel structure further includes a common electrode disposed on the gate insulating layer, wherein the common electrode is overlapped with a part of the conductive doping region.

In an embodiment of the present invention, the above-mentioned common electrode has an aperture located correspondingly to the first contact hole.

In an embodiment of the present invention, the above-mentioned common electrode is of cross-shape.

In an embodiment of the present invention, the above-mentioned pixel structure further includes a gate insulating layer, a first dielectric layer, a first contact conductor, a second contact conductor, a second dielectric layer and a padding layer. The gate insulating layer is disposed on the substrate to cover the patterned semiconductor layer, wherein the gate is disposed on the gate insulating layer, and the first dielectric layer is disposed on the gate insulating layer, a first contact hole and a second contact hole are formed within the first dielectric layer and the gate insulating layer to expose two portions of the patterned semiconductor layer, respectively. The first contact conductor is disposed on the first dielectric layer and electrically connected to the patterned semiconductor layer through the first contact hole. The second contact conductor is disposed on the first dielectric layer and electrically connected to the patterned semiconductor layer through the second contact hole. The second dielectric layer is disposed on the first dielectric layer. The padding layer is disposed on at least a part of the second dielectric layer, wherein a third contact hole is formed within the padding layer and the second dielectric to expose the first contact conductor, and the second dielectric layer has a fourth contact hole to expose the second contact conductor. The first pixel electrode is electrically connected to the first contact conductor through the third contact hole and the second pixel electrode is electrically connected to the second contact conductor through the fourth contact hole.

In an embodiment of the present invention, the above-mentioned patterned semiconductor layer is comprised of poly-silicon, monocrystalline silicon, microcrystalline silicon or amorphous silicon.

Since the present invention adopts the patterned semiconductor layer to deliver image data to the first pixel electrode and the second pixel electrode, so that no connecting portion is required between the first pixel electrode and the second pixel electrode, which significantly mitigate the mura after the LCD panel is pressed by an external force.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
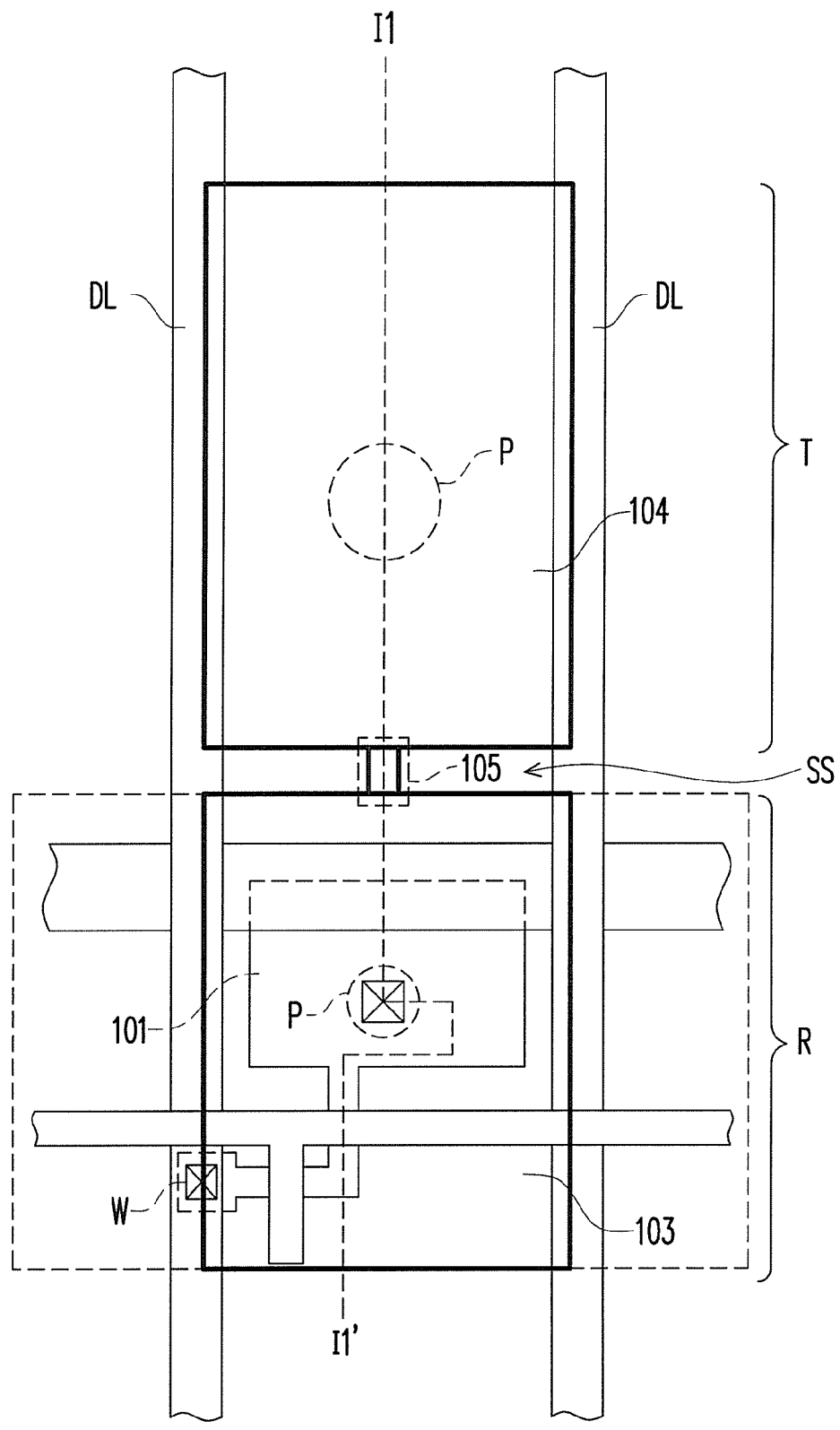
FIG. 1A is a top view diagram of a conventional LCD panel.

Reference will now be made in detail to the present preferred embodiments of the invention, examples of which are illustrated in the accompanying drawings. Wherever possible, the same reference numbers are used in the drawings and the description to refer to the same or like parts.

The First Embodiment

Figure 2A:
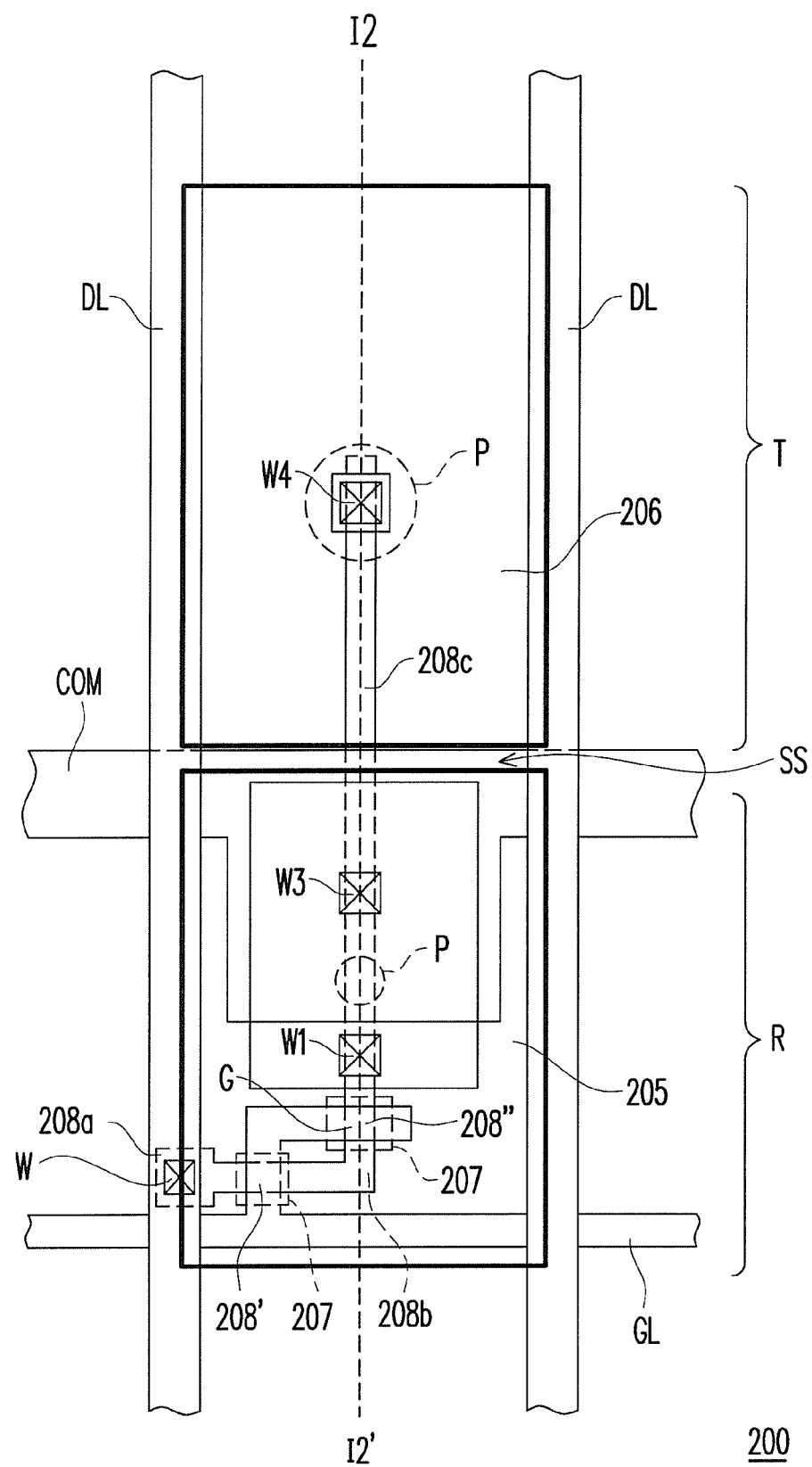
FIG. 2A is a top view diagram of an LCD panel according to the first embodiment of the present invention.
Figure 2B:
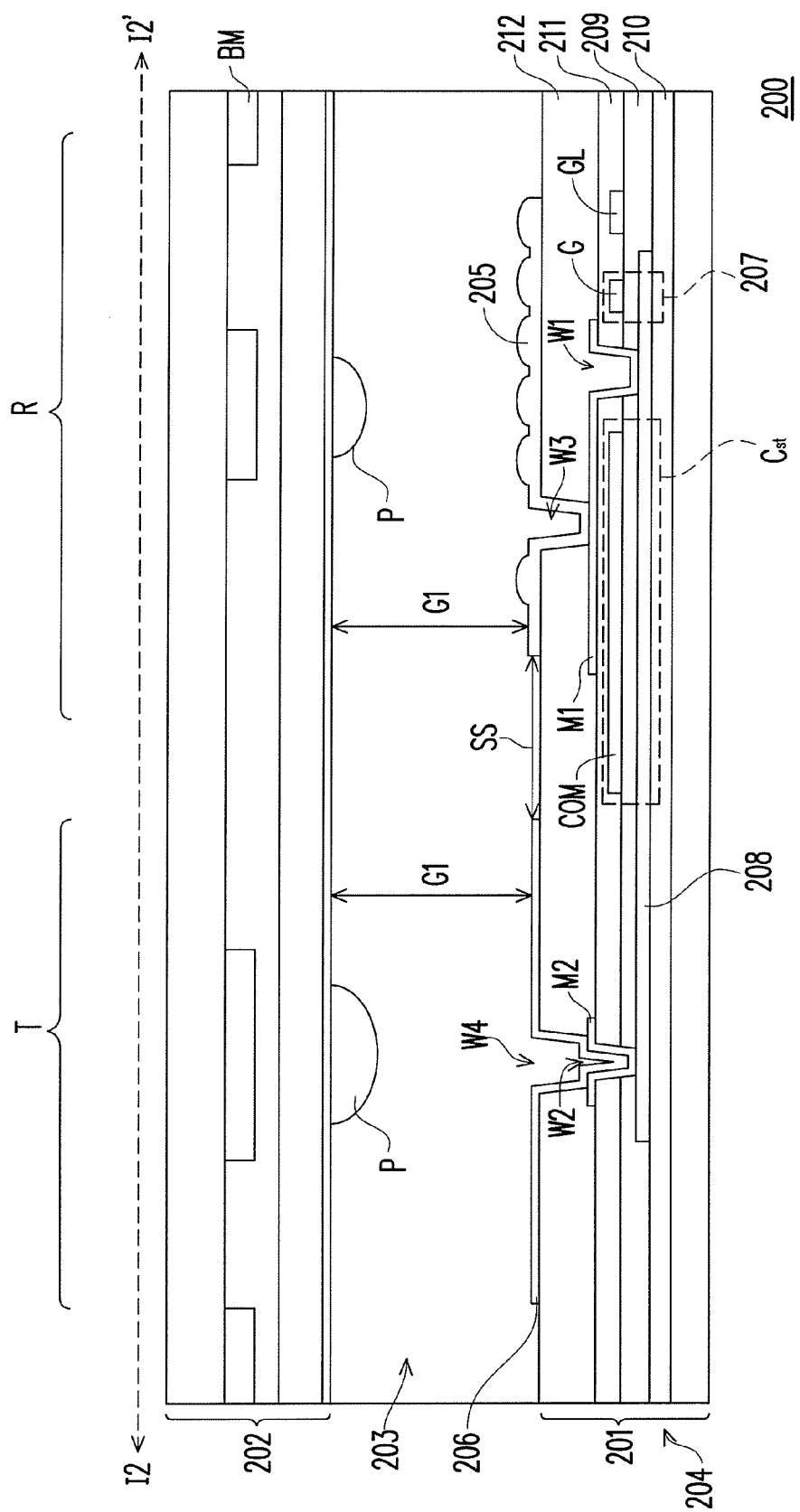
FIG. 2B is a cross-sectional diagram along the line I2-I2' of FIG. 2A.

FIG. 2A is a top view diagram of an LCD panel according to the first embodiment of the present invention and FIG. 2B is a cross-sectional diagram along the line I2-I2' of FIG. 2A. Referring to FIGS. 2A and 2B, an LCD panel 200 of the embodiment includes a TFT array substrate 201, an opposite substrate 202 and a liquid crystal layer 203. The TFT array substrate 201 has a plurality of pixel structures 204. Note that in FIG. 2A, only a pixel structure 204 of the TFT array substrate 201 and the opposite substrate 202 thereof are shown.

The opposite substrate 202 is disposed over the TFT array substrate 201, and the liquid crystal layer 203 is disposed between the TFT array substrate 201 and the opposite substrate 202. The opposite substrate 202 has a plurality of alignment protrusions P so as to make the liquid crystal molecules in the liquid crystal layer 203 tilt towards the alignment protrusions P, which enables the liquid crystal molecules in each pixel arranged in multi directions and thereby obtains a plurality of different alignment domains. Moreover, a black matrix BM is disposed over the alignment protrusions P and on the opposite substrate 202, wherein the black matrix BM has a single layer structure or multi-layers structure and is made of, for example, metal, organic material, color photoresist material or a combination of the above-mentioned materials. For example, the black matrix BM is formed by stacking a plurality of color photorsist layers.

As shown in FIG. 2B, the TFT array substrate 201 includes a pixel structure 204, and the pixel structure 204 includes a first pixel electrode 205, a second pixel electrode 206 and a top gate TFT 207. In the embodiment, the pixel structure 204 has a reflective region R and a transmissive region T. The first pixel electrode 205 is a reflective pixel electrode located in the reflective region R and the second pixel electrode 206 is a transmissive pixel electrode located in the transmissive region T. In addition, the alignment protrusions P of the opposite substrate 202 are respectively located over the first pixel electrode 205 and the second pixel electrode 206.

When images are displayed by the transflective pixel structure of the embodiment, the pixel electrode 206 within the transmissive region T serves as a transparent electrode, so that the light emitted from a backlight source can pass through the pixel electrode 206. On the other hand, the pixel electrode 205 located in the reflective region R is a metal reflective electrode or other reflective electrodes made of materials with good reflectivity so as to achieve the displaying effect by reflecting the light emitted from a front-light source and/or an environmental light source. In the embodiment, the first pixel electrode 205 is an aluminium electrode, for example, with bumps formed on the surface thereof, and the second pixel electrode 206 serving as a transmissive pixel electrode is made of indium-tin oxide (ITO) or indium-zinc oxide (IZO), for example.

Note that a continuous main slit SS is located between the first pixel electrode 205 and the second pixel electrode 206 to physically separate the two pixel electrodes 205 and 206 from each other. The present invention is not limited to the material and the number of the above-mentioned pixel electrode of the embodiment. For example, when the transmissive region T requires a larger area, the number of the transmissive region T can be two or more than two. In addition, the pixel structure 204 can further include a gate insulating layer 209, a buffer layer 210, a first dielectric layer 211, a first contact conductor M1, a second contact conductor M2, a second dielectric layer 212 and a common electrode COM.

The top gate TFT 207 is disposed between the TFT array substrate 201 and the first pixel electrode 205 and includes a patterned semiconductor layer 208 and a gate G. The patterned semiconductor layer 208 herein extends from below the first pixel electrode 205 to below the second pixel electrode 206 and is electrically connected to the first pixel electrode 205 and the second pixel electrode 206. In the embodiment, the patterned semiconductor layer 208 is comprised of poly-silicon, monocrystalline silicon, microcrystalline silicon or amorphous silicon, for example. The buffer layer 210 is optionally disposed between the substrate 201 and the patterned semiconductor layer 208, as shown in FIG. 2B.

The gate insulating layer 209 is disposed on the substrate 201 to cover the patterned semiconductor layer 208, wherein the gate G is disposed on the gate insulating layer 209. The first dielectric layer 211 is disposed on the gate insulating layer 209, wherein a first contact hole W1 and a second contact hole W2 are formed within the first dielectric layer 211 and the gate insulating layer 209 to expose two portions of the patterned semiconductor layer 208, respectively. The first contact conductor M1 is disposed on the first dielectric layer 211 and is electrically connected to the patterned semiconductor layer 208 through the first contact hole W1. The second contact conductor M2 is disposed on the first dielectric layer 211 and is electrically connected to the patterned semiconductor layer 208 through the second contact hole W2. The second dielectric layer 212 is disposed on the first dielectric layer 211 and has a third contact hole W3 and a fourth contact hole W4 to respectively expose the first contact conductor M1 and the second contact conductor M2. The first pixel electrode 205 is electrically connected to the first contact conductor M1 through the third contact hole W3, and the second pixel electrode 206 is electrically connected to the second contact conductor M2 through the fourth contact hole W4.

As shown in FIG. 2B, the positions of the second contact hole W2, the fourth contact hole W4 and the second contact conductor M2 are corresponding to the positions of the alignment protrusions P of the opposite substrate 202. In this way, the black matrix BM over the alignment protrusions P can effectively shield the leakage light around the fourth contact hole W4 and the second contact conductor M2 can effectively shield the leakage light around the alignment protrusions P. In some of the embodiments, the second contact hole W2 can be aligned with or staggered from the fourth contact hole W4 according to different panel processes. Similarly, the first contact hole W1 can be aligned with or staggered from the third contact hole W3. In the embodiment, the common electrode COM is disposed on the gate insulating layer 209 and overlapped with the patterned semiconductor layer 208. More specifically, the common electrode COM is overlapped with a part of the patterned semiconductor layer 208, and the gate insulating layer 209 is located between the common electrode COM and the part of the patterned semiconductor layer 208, such that the common electrode COM together with the part of the patterned semiconductor layer 208 forms a storage capacitor Cst.

Figure 1B:
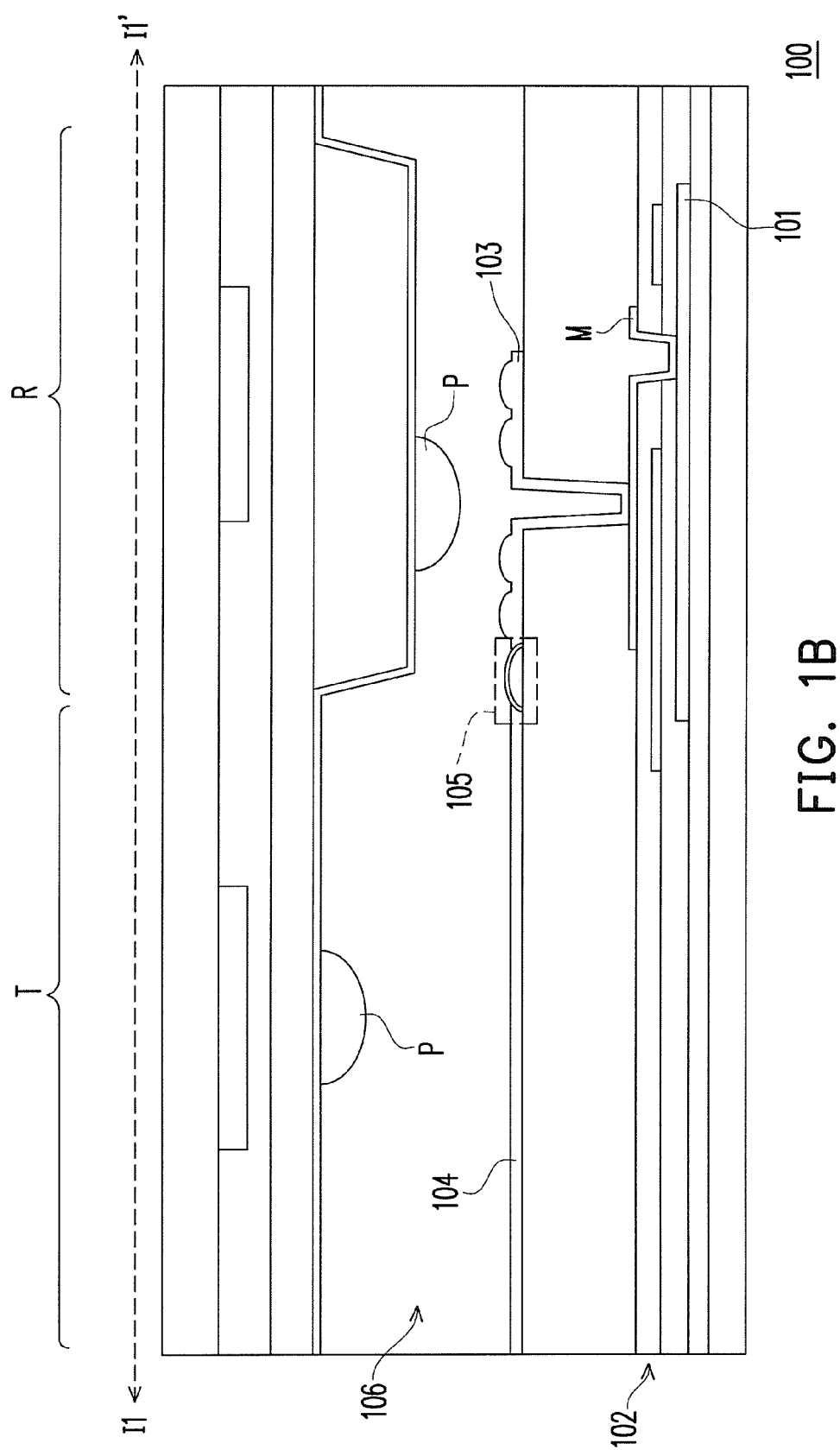
FIG. 1B is a cross-sectional diagram along the line I1-I1' of FIG. 1A.

Referring to FIGS. 2A and 2B, when a turn-on signal is transmitted from a scan line GL to the gate G of the top gate TFT 207, the top gate TFT 207 is turned on and an image signal is transmitted from a data line DL to the contact hole W in the first dielectric layer 211. Then, the image signal transmitted by the data line DL is transmitted to the patterned semiconductor layer 208 through the contact hole W. Next, the image signal is transmitted to the second contact conductor M2 formed in the second contact hole W2 and the first contact conductor M1 formed in the first contact hole W1 though the patterned semiconductor layer 208. As shown in FIGS. 2A and 2B, since the first pixel electrode 205 is electrically connected to the first contact conductor M1 via the third contact hole W3 and the second pixel electrode 206 is electrically connected to the second contact conductor M2 via the fourth contact hole W4, the patterned semiconductor layer 208 can transmit the image signals from the data line DL to the first pixel electrode 205 and the second pixel electrode 206. In the embodiment, the patterned semiconductor layer 208 directly transmits the image signal from the data line DL to the electrodes 206 and 205 respectively located in the transmissive region T and the reflective region R through the contact holes W1-W4 and the contact conductors M1 and M2, which is different from the prior art where a connecting potion 105 (as shown in FIG. 1B) is used to transmit the image signals.

As shown in FIG. 2A, the patterned semiconductor layer 208 is substantially of L-shape and has a plurality of conductive doping regions 208a, 208b and 208c and two channel regions 208' and 208" between the conductive doping regions, wherein the conductive doping region 208c extends from below the first pixel electrode 205 to below the second pixel electrode 206 and is electrically connected to the first pixel electrode 205 and the second pixel electrode 206. In addition, the gate G is, for example, a conductive line with a branch, which is located over the above-mentioned channel regions 208' and 208" to cover channel regions 208' and 208" so as to form a plurality of top gates TFT 207.

Figure 2C:
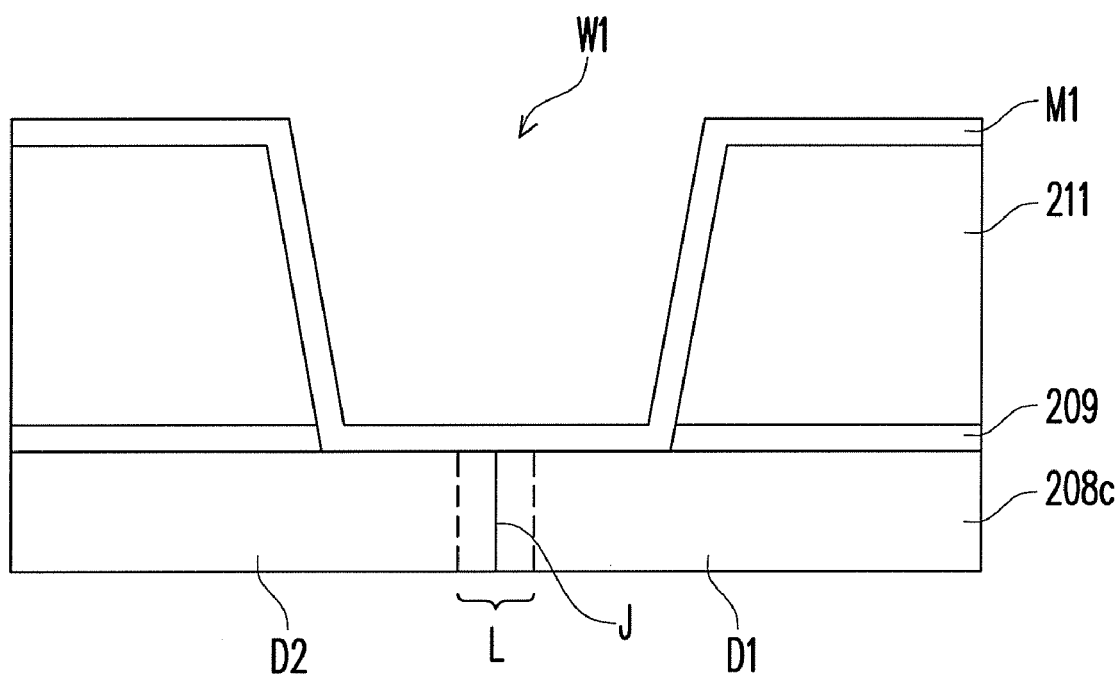
FIG. 2C is a localized enlargement diagram of FIG. 2B where a part of the first contact conductor and a part of the patterned semiconductor layer near the first contact hole are shown.

FIG. 2C is a localized enlargement diagram of FIG. 2B where a part of the first contact conductor and a part of the patterned semiconductor layer near the first contact hole are shown. Referring to FIG. 2C, the first contact conductor M1 is disposed on the first dielectric layer 211 and is electrically connected to the patterned semiconductor layer 208 through the first contact hole W1. The conductive doping region 208c electrically connected to both the first pixel electrode 205 and the second pixel electrode 206 includes a first type doping region D1 and a second type doping region D2. The second type doping region D2 is connected to the first type doping region D1, wherein the first pixel electrode 205 is electrically connected to both the first type doping region D1 and the second type doping region D2, and the second pixel electrode 206 is electrically connected to second type doping region D2 only.

The conductive doping region 208c of the storage capacitor Cst has, for example, both N-type doped sub-region and P-type doped sub-region. The two different doping sub-regions share a border right below the first contact hole W1, for example, first type doping region D1 and the second type doping region D2. Since the junction (i.e., the above-mentioned border) between the first type doping region D1 and the second type doping region D2 is a P-N junction J, so that a depletion region L is formed at the junction which is unfavourable to conduct current. Therefore, the embodiment utilizes the first contact conductor M1 electrically connected to the conductive doping region 208c through the first contact hole W1 to provide another current conductive path. In this way, when the patterned semiconductor layer 208 transmits the image signals to the first pixel electrode 205 and the second pixel electrode 206, the possible negative impact by the depletion region L of the p-n junction J can be avoided.

The embodiment uses the patterned semiconductor layer 208 to transmit image signals to the first pixel electrode 205 and the second pixel electrode 206, which effectively avoids the serious twist of the electric field occurred near the connecting portion 105 and mitigates the finger press mura.

The Second Embodiment

In the following embodiments and figures, all the same or similar parts are represented by the same marks for depiction simplicity.

Figure 3A:
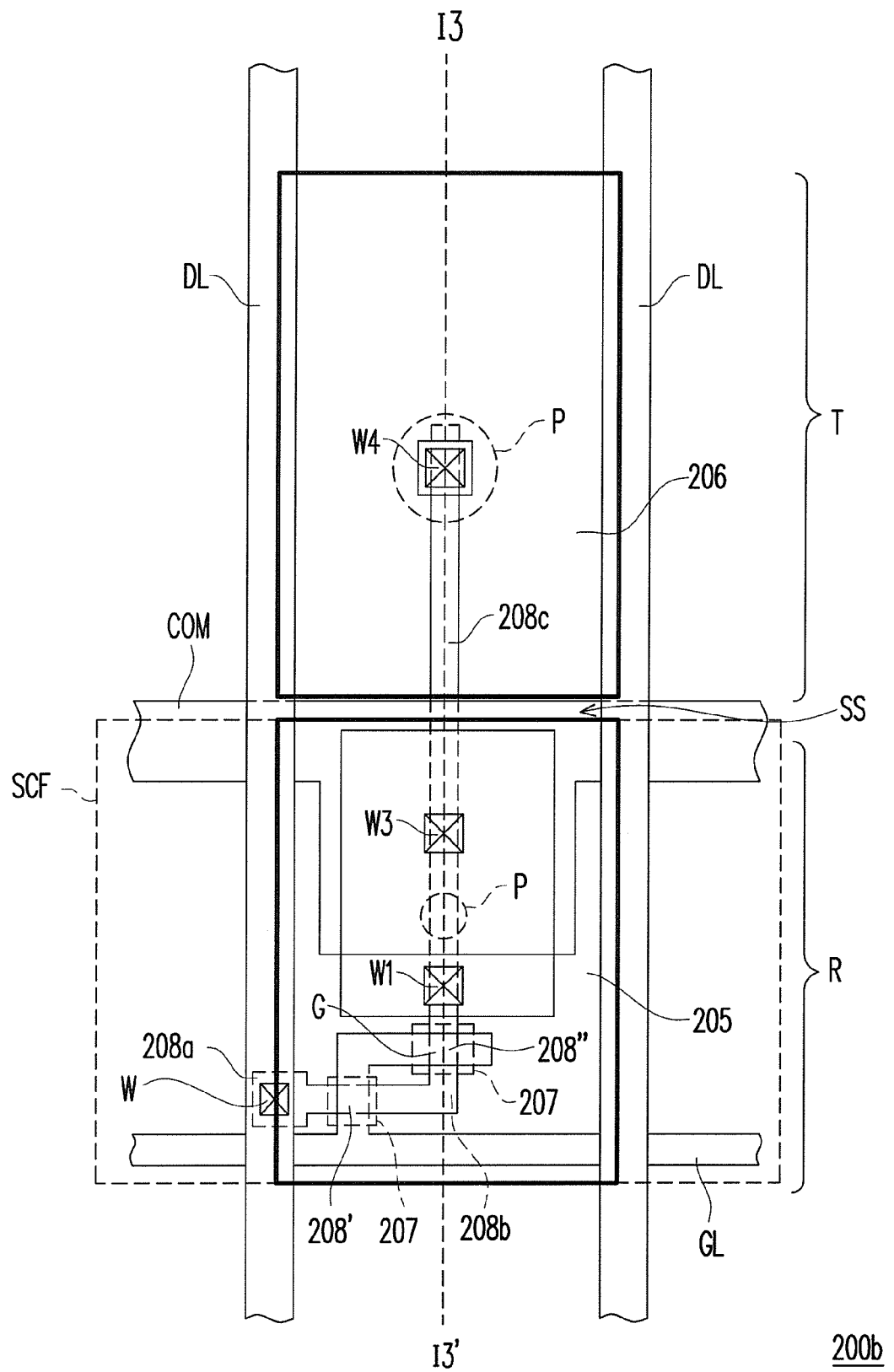
FIG. 3A is a top view diagram of an LCD panel according to the second embodiment of the present invention.
Figure 3B:
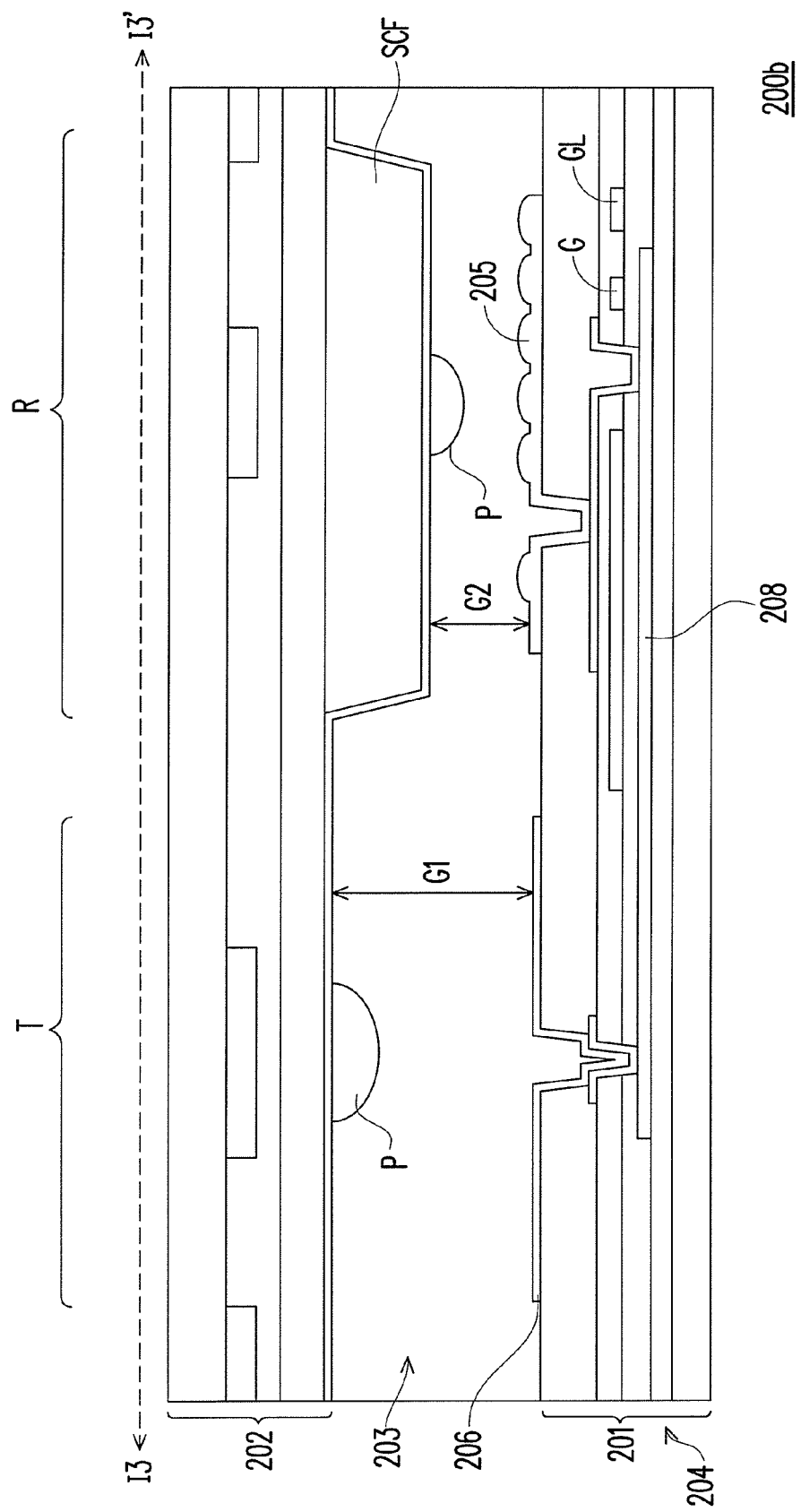
FIG. 3B is a cross-sectional diagram along the line I3-I3' of FIG. 3A.

FIG. 3A is a top view diagram of an LCD panel according to the second embodiment of the present invention and FIG. 3B is a cross-sectional diagram along the line I3-I3' of FIG. 3A. Referring to FIGS. 3A and 3B, an LCD panel 200b of the embodiment is similar to the LCD panel 200 of the first embodiment except that an alignment pattern SCF is disposed over the first pixel electrode 205 in the LCD panel 200b. The alignment pattern SCF is disposed on the opposite substrate 202 and an alignment protrusion P is disposed below the alignment pattern SCF. In the MVA LCD panel of the present embodiment, the liquid crystal molecules in each pixel are arranged in multi directions by using an alignment pattern SCF together with a plurality of alignment protrusions P and thereby a plurality of different alignment domains is obtained so as to achieve the required wide-viewing angle.

Accordingly, by disposing an alignment pattern SCF over the first pixel electrode 205 of the first embodiment, the cell-gaps of the liquid crystal layer 203 within the reflective region R can be changed so that the transflective pixel structure 204 of the embodiment is modified into a dual cell-gaps structure; that is, the transmissive region T and the reflective region R respectively have a liquid crystal layer 203 having different thicknesses. For example, the cell gap of the liquid crystal layer 203 within the transmissive region T is G1 and the cell gap of the liquid crystal layer 203 within the reflective region R in the first embodiment is also G1 before disposing the alignment pattern SCF. After disposing the alignment pattern SCF, the cell gap of the liquid crystal layer 203 within the reflective region R in the second embodiment is changed to G2, wherein G2 is a half of G1.

The dual cell-gaps structure provided by the embodiment enables the transmissive region T and the reflective region R to have substantially the same phase retardation, which further enhances the display quality of the transflective LCD panel 200b.

The Third Embodiment

Figure 4A:
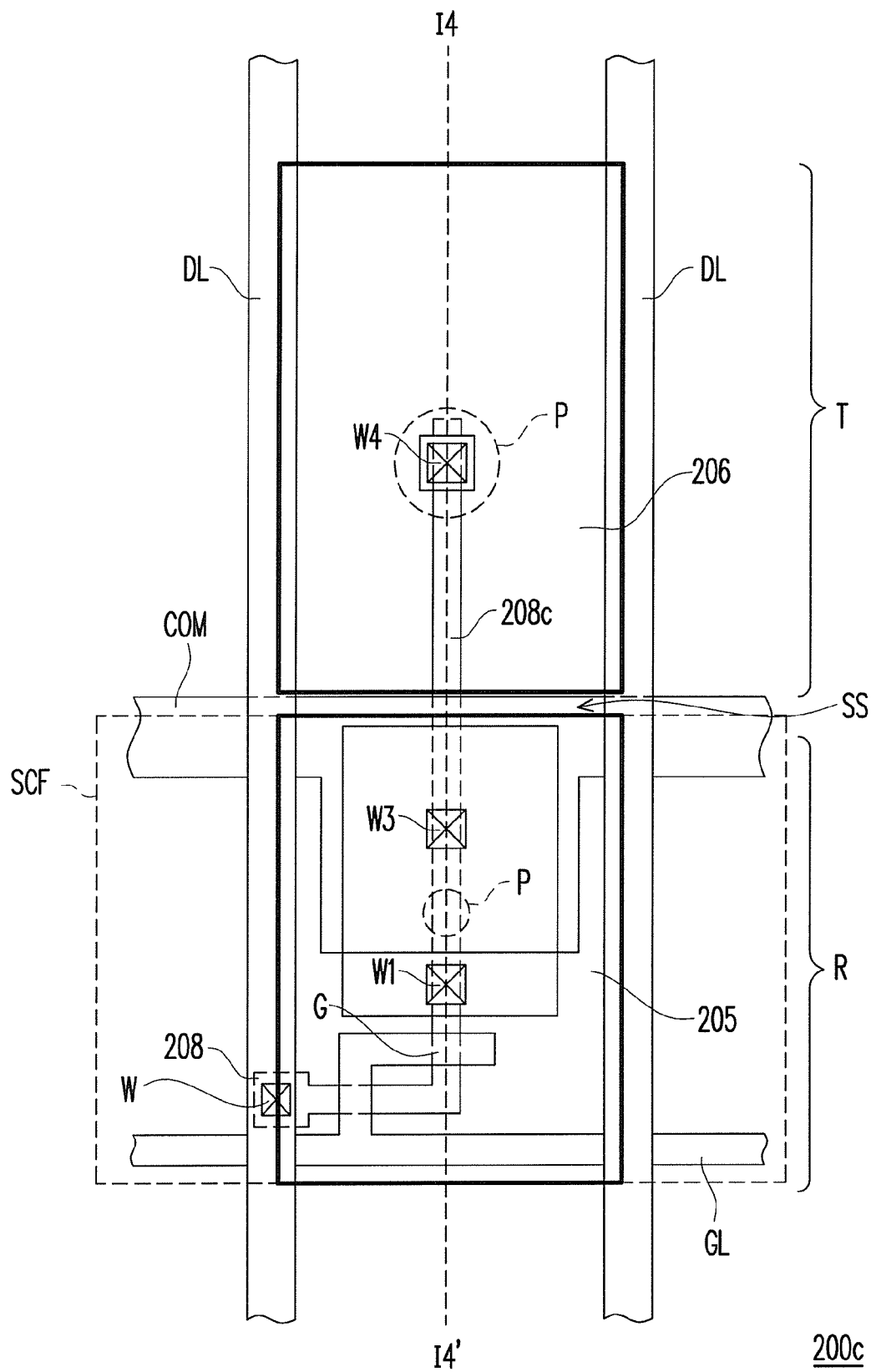
FIG. 4A is a top view diagram of an LCD panel according to the third embodiment of the present invention.
Figure 4B:
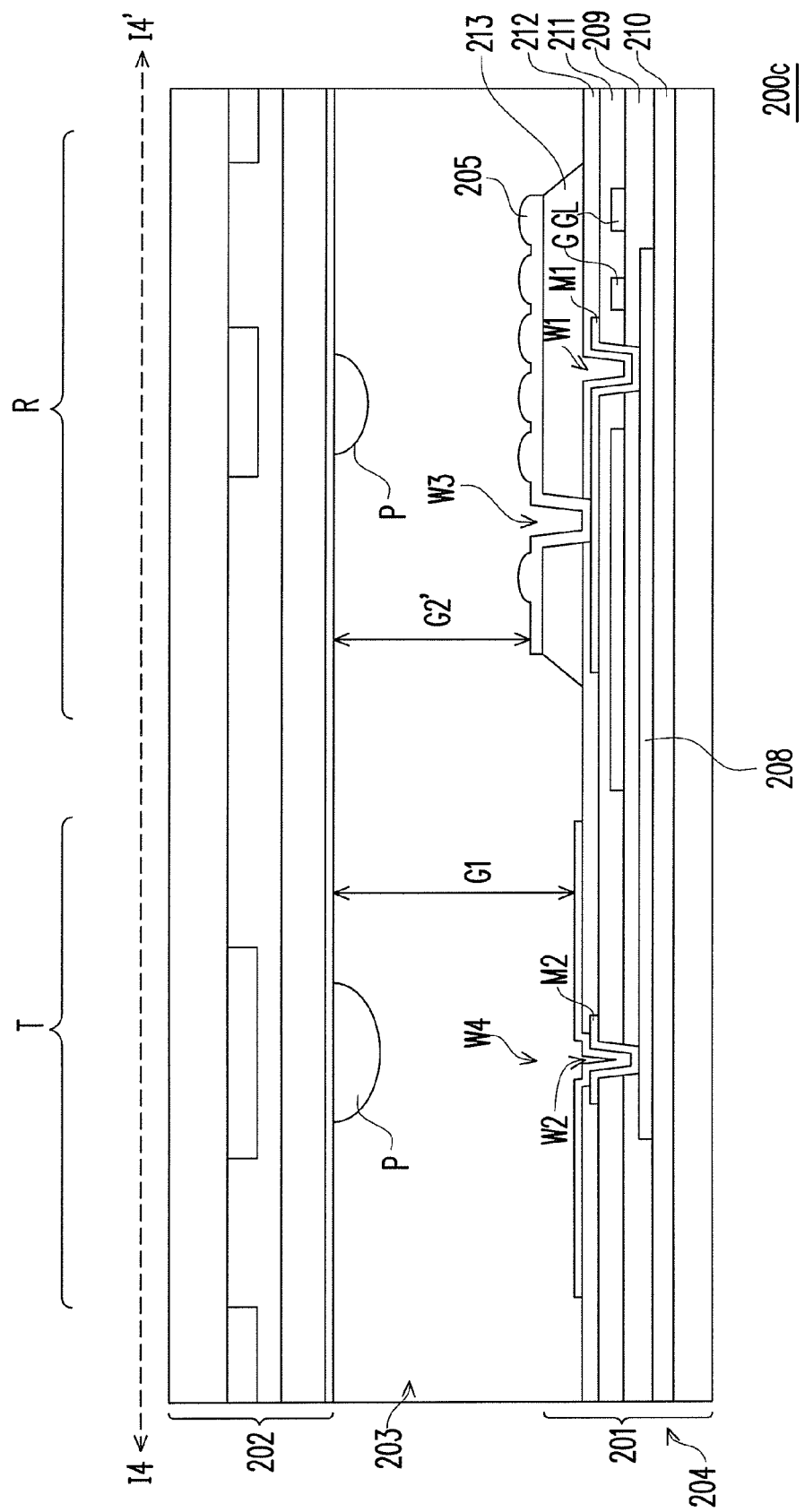
FIG. 4B is a cross-sectional diagram along the line I4-I4' of FIG. 4A.

FIG. 4A is a top view diagram of an LCD panel according to the third embodiment of the present invention and FIG. 4B is a cross-sectional diagram along the line I4-I4' of FIG. 4A. Referring to FIGS. 4A and 4B, an LCD panel 200c of the embodiment is similar to the LCD panel 200b of the second embodiment except that a padding layer 213 located in the reflective region R of the LCD panel 200c is disposed on a part of the second dielectric layer 212.

In more detail, the pixel structure 204 of the embodiment further includes a gate insulating layer 209, a first dielectric layer 211, a first contact conductor M1, a second contact conductor M2, a second dielectric layer 212 and a padding layer 213. The gate insulating layer 209 covers the patterned semiconductor layer 208, wherein the gate G is disposed on the gate insulating layer 209. The first dielectric layer 211 is disposed on the gate insulating layer 209, wherein a first contact hole W1 and a second contact hole W2 are formed within the first dielectric layer 211 and the gate insulating layer 209 to expose two portions of the patterned semiconductor layer 208, respectively. The first contact conductor M1 is disposed on the first dielectric layer 211 and is electrically connected to the patterned semiconductor layer 208 through the first contact hole W1. The second contact conductor M2 is disposed on the first dielectric layer 211 and is electrically connected to the patterned semiconductor layer 208 through the second contact hole W2. The second dielectric layer 212 is disposed on the first dielectric layer 211. The padding layer 213 is disposed on a part of the second dielectric layer 212, wherein a third contact hole W3 is formed within the padding layer 213 and the second dielectric layer 212 to expose the first contact conductor M1. The second dielectric layer 212 has a fourth contact hole W4 to expose the second contact conductor M2. The first pixel electrode 205 is electrically connected to the first contact conductor M1 through the third contact hole W3, and the second pixel electrode 206 is electrically connected to the second contact conductor M2 through the fourth contact hole W4.

The padding layer 213 functions similarly to the alignment pattern SCF of the second embodiment. In other words, the cell gap G2' of the liquid crystal layer within the reflective region R is adjusted by the padding layer 213, wherein G2' is a half of cell gap G1 of the liquid crystal layer within the transmissive region T, so that the display quality of the transflective LCD panel 200c is further promoted.

The Fourth Embodiment

Figure 5A:
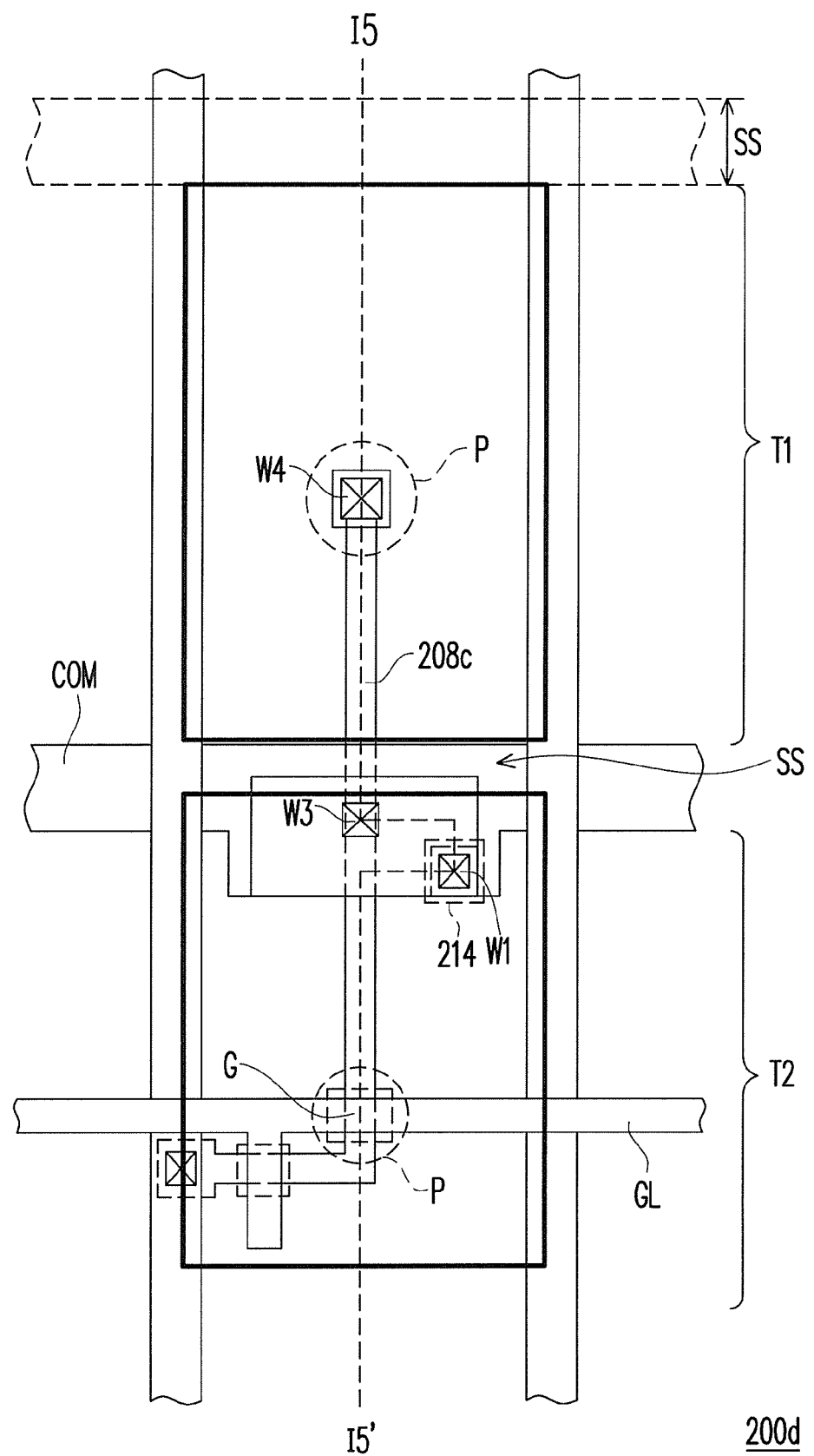
FIG. 5A is a top view diagram of an LCD panel according to the fourth embodiment of the present invention.
Figure 5B:
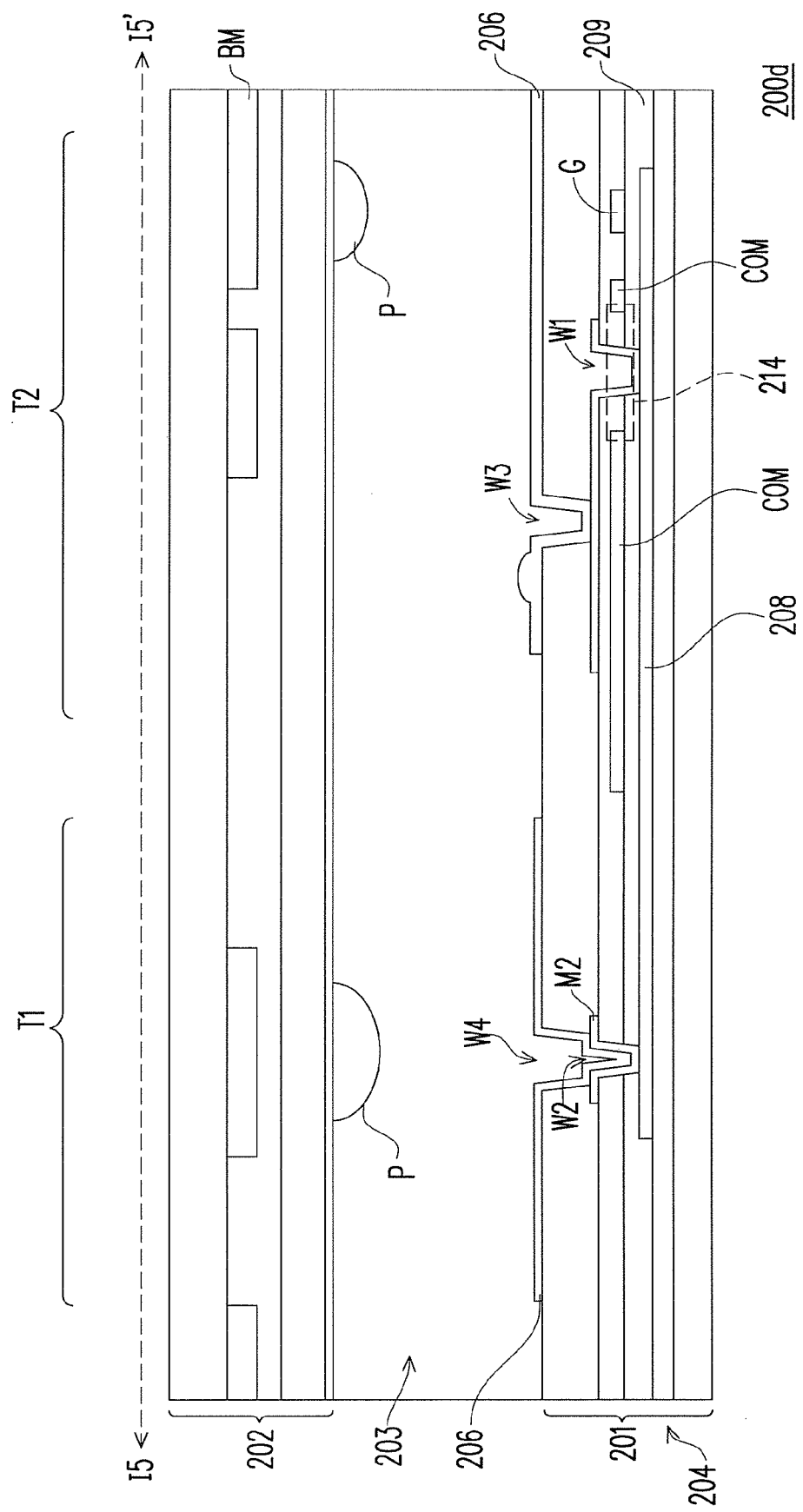
FIG. 5B is a cross-sectional diagram along the line I5-I5' of FIG. 5A.

FIG. 5A is a top view diagram of an LCD panel according to the fourth embodiment of the present invention and FIG. 5B is a cross-sectional diagram along the line I5-I5' of FIG. 5A. Referring to FIGS. 5A and 5B, an LCD panel 200d of the embodiment is similar to the LCD panel 200 of the first embodiment except that both the first pixel electrode 205 and the second pixel electrode 206 of the LCD panel 200d are transmissive pixel electrodes. In other words, the pixel structure 204 of the LCD panel 200d has two transmissive regions T1 and T2. Note that in other embodiments, both the first pixel electrode 205 and the second pixel electrode 206 of the LCD panel can be reflective pixel electrodes as well.

As shown in FIG. 5B, another difference of the LCD panel 200d from the LCD panel 200 of the first embodiment rests in that the common electrode COM of the embodiment is disposed on the gate insulating layer 209 and has an aperture 214 at the position of the first contact hole W1, wherein the common electrode COM is overlapped with a part of the conductive doping region 208 to form a storage capacitor Cst.

The Fifth Embodiment

Figure 6A:
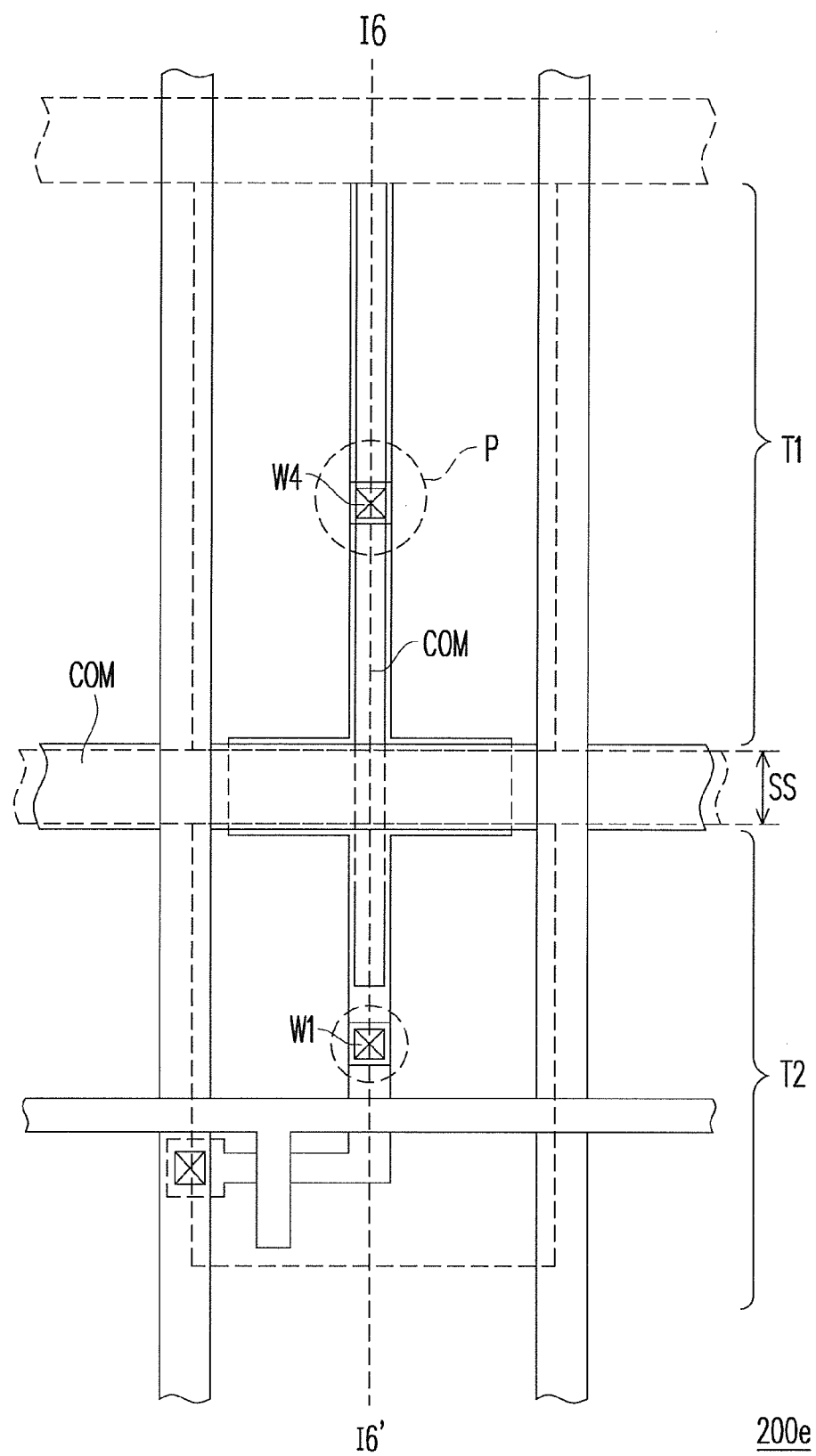
FIG. 6A is a top view diagram of an LCD panel according to the fifth embodiment of the present invention.
Figure 6B:
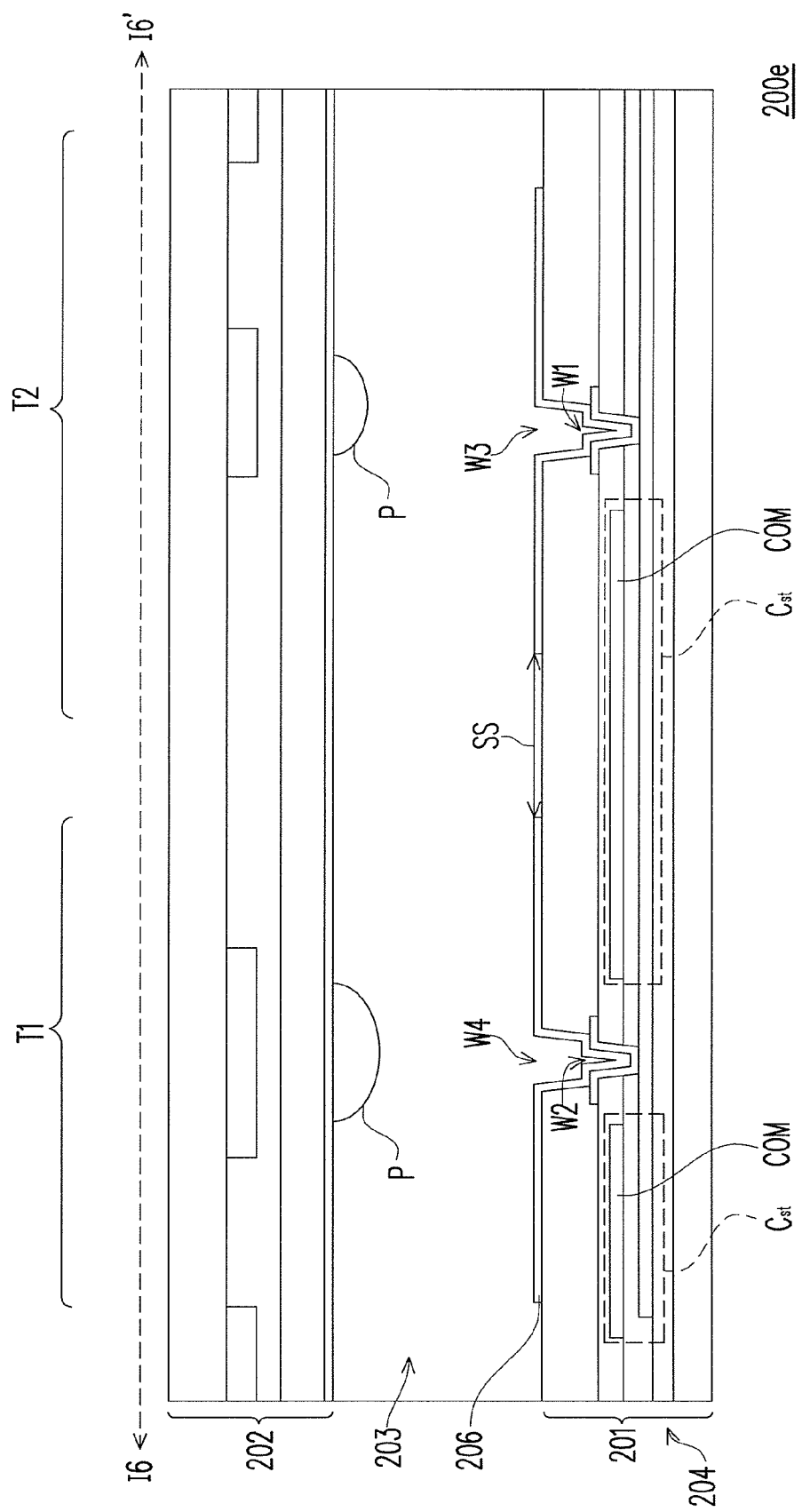
FIG. 6B is a cross-sectional diagram along the line I6-I6' of FIG. 6A.

FIG. 6A is a top view diagram of an LCD panel according to the fifth embodiment of the present invention and FIG. 6B is a cross-sectional diagram along the line I6-I6' of FIG. 6A. Referring to FIGS. 6A and 6B, an LCD panel 200e of the embodiment is similar to the LCD panel 200d of the fourth embodiment except that the common electrode COM of the pixel structure 204 in the embodiment is of cross-shape. In more detail, the common electrode COM is distributed not only below the main slit SS between the first transmissive region T1 and the second transmissive region T2, but also on the linking line between the third contact hole W3 and the fourth contact hole W4, wherein the common electrode COM in cross-shape is able to increase the capacitance of the storage capacitor Cst.

In summary, the LCD panel of the present invention has at least following advantages:

1. Since the present invention adopts the patterned semiconductor layer to transmit image signal to the first pixel electrode and the second pixel electrode without using a connecting portion; therefore, the liquid crystal molecules are not affected by twist electric field caused by the conventional connecting portion, which is favourable to mitigate the finger press mura after the LCD panel is pressed by an external force.

2. In some of the embodiments of the present invention, the pixel structure can be changed into a dual cell-gaps structure by design depending on the application requirement, which promotes the display quality of the transflective LCD panel.

3. In some of the embodiments of the present invention, a common electrode in cross-shape is used to increase the capacitance of the storage capacitor Cst, so as to reduce the voltage variation caused by a capacitor coupling effect, which further enhances the display quality of the panel.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pixel structure disposed on a substrate, comprising:
   a first pixel electrode disposed over the substrate;
   a second pixel electrode disposed over the substrate, wherein the first pixel electrode and the second pixel electrode are separated from each other; and
   a top gate thin film transistor disposed between the substrate and the first pixel electrode, wherein the top gate thin film transistor comprises:
      a patterned semiconductor layer disposed on the substrate, wherein the patterned semiconductor layer has a plurality of conductive doping regions and at least a channel region between the conductive doping regions, one of the conductive doping regions extends from below the first pixel electrode to below the second pixel electrode and is electrically connected to the first pixel electrode and the second pixel electrode; and
      a gate disposed over the channel regions.

2. The pixel structure according to claim 1, wherein the first pixel electrode and the second pixel electrode are reflective or transmissive.

3. The pixel structure according to claim 1, wherein the patterned semiconductor layer is substantially of L-shape.

4. The pixel structure according to claim 3, wherein the patterned semiconductor layer has three conductive doping regions and two channel regions, and each of the channel regions is respectively connected between two of the conductive doping regions.

5. The pixel structure according to claim 4, wherein the gate is a conductive line with a branch and the conductive line is located over and covers all the channel regions.

6. The pixel structure according to claim 1, further comprising:
   a gate insulating layer disposed on the substrate to cover the patterned semiconductor layer, wherein the gate is disposed on the gate insulating layer;
   a first dielectric layer disposed on the gate insulating layer, wherein a first contact hole and a second contact hole are formed within the first dielectric layer and the gate insulating layer to expose two portions of the patterned semiconductor layer, respectively;
   a first contact conductor disposed on the first dielectric layer and electrically connected to the patterned semiconductor layer through the first contact hole;
   a second contact conductor disposed on the first dielectric layer and electrically connected to the patterned semiconductor layer through the second contact hole; and
   a second dielectric layer disposed on the first dielectric layer, wherein the second dielectric layer has a third contact hole and a fourth contact hole to respectively expose the first contact conductor and the second contact conductor, the first pixel electrode is electrically connected to the first contact conductor through the third contact hole and the second pixel electrode is electrically connected to the second contact conductor through the fourth contact hole, the conductive doping region electrically connected to both the first pixel electrode and the second pixel electrode comprises:
      a first type doping region; and a second type doping region connected to the first type doping region, wherein the first contact conductor contacts the first type doping region and the second type doping region, and the second contact conductor electrically contacts the second type doping region only.

7. The pixel structure according to claim 1, further comprising:
a gate insulating layer disposed on the substrate to cover the patterned semiconductor layer, wherein the gate is disposed on the gate insulating layer;
a first dielectric layer disposed on the gate insulating layer, wherein a first contact hole and a second contact hole are formed within the first dielectric layer and the gate insulating layer to expose two portions of the patterned semiconductor layer, respectively;
a first contact conductor disposed on the first dielectric layer and electrically connected to the patterned semiconductor layer through the first contact hole;
a second contact conductor disposed on the first dielectric layer and electrically connected to the patterned semiconductor layer through the second contact hole; and
a second dielectric layer disposed on the first dielectric layer, wherein the second dielectric layer has a third contact hole and a fourth contact hole to respectively expose the first contact conductor and the second contact conductor, the first pixel electrode is electrically connected to the first contact conductor through the third contact hole and the second pixel electrode is electrically connected to the second contact conductor through the fourth contact hole.

8. The pixel structure according to claim 7, further comprising a common electrode disposed on the gate insulating layer, wherein the common electrode is overlapped with a part of the conductive doping region.

9. The pixel structure according to claim 8, wherein the common electrode has an aperture located correspondingly to the first contact hole and is of cross-shape.

10. The pixel structure according to claim 1, further comprising:
a gate insulating layer disposed on the substrate to cover the patterned semiconductor layer, wherein the gate is disposed on the gate insulating layer;
a first dielectric layer disposed on the gate insulating layer, wherein a first contact hole and a second contact hole are formed within the first dielectric layer and the gate insulating layer to expose two portions of the patterned semiconductor layer, respectively;
a first contact conductor disposed on the first dielectric layer and electrically connected to the patterned semiconductor layer through the first contact hole;
a second contact conductor disposed on the first dielectric layer and electrically connected to the patterned semiconductor layer through the second contact hole;
a second dielectric layer disposed on the first dielectric layer; and
a padding layer disposed on at least a part of the second dielectric layer, wherein a third contact hole is formed within the padding layer and the second dielectric layer to expose the first contact conductor, the second dielectric layer has a fourth contact hole to expose the second contact conductor, the first pixel electrode is electrically connected to the first contact conductor through the third contact hole and the second pixel electrode is electrically connected to the second contact conductor through the fourth contact hole.

11. The pixel structure according to claim 1, wherein the patterned semiconductor layer is comprised of poly-silicon, monocrystalline silicon, microcrystalline silicon or amorphous silicon.

12. A liquid crystal display panel, comprising:
a thin film transistor array substrate having a plurality of pixel structures, each of the pixel structures comprising:
a first pixel electrode disposed over the substrate;
a second pixel electrode disposed over the substrate, wherein the first pixel electrode and the second pixel electrode are separated from each other;
a top gate thin film transistor disposed between the substrate and the first pixel electrode, wherein the top gate thin film transistor comprises:
a patterned semiconductor layer disposed on the substrate, wherein the patterned semiconductor layer has a plurality of conductive doping regions and at least a channel region between the conductive doping regions, one of the conductive doping regions extends from below the first pixel electrode to below the second pixel electrode and is electrically connected to the first pixel electrode and the second pixel electrode; and
a gate disposed over the channel regions;
an opposite substrate disposed over the thin film transistor array substrate; and
a liquid crystal layer disposed between the thin film transistor array substrate and the opposite substrate.

13. The liquid crystal display panel according to claim 12, wherein the first pixel electrode and the second pixel electrode are reflective or transmissive.

14. The liquid crystal display panel according to claim 12, wherein the patterned semiconductor layer is substantially of L-shape.

15. The liquid crystal display panel according to claim 12, wherein the pixel structure further comprises:
a gate insulating layer, disposed on the substrate to cover the patterned semiconductor layer, wherein the gate is disposed on the gate insulating layer;
a first dielectric layer disposed on the gate insulating layer, wherein a first contact hole and a second contact hole are formed within the first dielectric layer and the gate insulating layer to expose two portions of the patterned semiconductor layer, respectively;
a first contact conductor, disposed on the first dielectric layer and electrically connected to the patterned semiconductor layer through the first contact hole;
a second contact conductor, disposed on the first dielectric layer and electrically connected to the patterned semiconductor layer through the second contact hole; and
a second dielectric layer, disposed on the first dielectric layer, wherein the second dielectric layer has a third contact hole and a fourth contact hole to respectively expose the first contact conductor and the second contact conductor, the first pixel electrode is electrically connected to the first contact conductor through the third contact hole and the second pixel electrode is electrically connected to the second contact conductor through the fourth contact hole.

16. The liquid crystal display panel according to claim 15, wherein the pixel structure further comprises a common electrode disposed on the gate insulating layer, wherein the common electrode is overlapped with a part of the conductive doping region.

17. The liquid crystal display panel according to claim 16, wherein the common electrode has an aperture located correspondingly to the first contact hole.

18. The liquid crystal display panel according to claim 16, wherein the common electrode is of cross-shape.

19. The liquid crystal display panel according to claim 12, wherein the pixel structure further comprises:
   a gate insulating layer, disposed on the substrate to cover the patterned semiconductor layer, wherein the gate is disposed on the gate insulating layer;
   a first dielectric layer disposed on the gate insulating layer, wherein a first contact hole and a second contact hole are formed within the first dielectric layer and the gate insulating layer to expose two portions of the patterned semiconductor layer, respectively;
   a first contact conductor, disposed on the first dielectric layer and electrically connected to the patterned semiconductor layer through the first contact hole;
   a second contact conductor, disposed on the first dielectric layer and electrically connected to the patterned semiconductor layer through the second contact hole;
   a second dielectric layer, disposed on the first dielectric layer; and
   a padding layer, disposed on at least a part of the second dielectric layer, wherein a third contact hole is formed within the padding layer and the second dielectric layer to expose the first contact conductor, the second dielectric layer has a fourth contact hole to expose the second contact conductor, the first pixel electrode is electrically connected to the first contact conductor through the third contact hole and the second pixel electrode is electrically connected to the second contact conductor through the fourth contact hole.

20. The liquid crystal display panel according to claim 12, wherein the opposite substrate has a plurality of alignment protrusions, and the alignment protrusions are located over the first pixel electrodes and the second pixel electrodes.

* * * * *